United States Patent [19]

Collins et al.

[11] Patent Number: 5,175,496
[45] Date of Patent: Dec. 29, 1992

[54] DUAL CONTACT BEAM ASSEMBLY FOR AN IC TEST FIXTURE

[75] Inventors: David R. Collins, Eau Claire; Mary A. Nebel, Chippewa Falls; Bruce A. Strangfeld, Eau Claire, all of Wis.

[73] Assignee: Cray Research, Inc., Eagan, Minn.

[21] Appl. No.: 575,935

[22] Filed: Aug. 31, 1990

[51] Int. Cl.⁵ .................. G01R 1/06; G01R 31/02
[52] U.S. Cl. ..................... 324/158 P; 324/158 F
[58] Field of Search ........... 324/158 F, 158 P, 72.5, 324/500, 537; 439/482, 824

[56] References Cited

U.S. PATENT DOCUMENTS

| | | |
|---|---|---|
| 3,806,801 | 4/1974 | Bove .................. 324/158 F |
| 3,849,728 | 11/1974 | Evans ................. 324/158 F |
| 3,906,363 | 9/1975 | Fowler ................ 324/158 F |
| 4,027,935 | 6/1977 | Byrnes et al. ......... 324/158 F |
| 4,061,969 | 12/1977 | Dean .................. 324/158 P |
| 4,423,376 | 12/1983 | Byrnes et al. ......... 324/158 F |
| 4,574,235 | 3/1986 | Kelly et al. . |
| 4,789,859 | 12/1988 | Clarkson et al. . |
| 4,816,754 | 3/1989 | Buechele et al. ....... 324/158 F |
| 4,901,013 | 2/1990 | Benedetto et al. ...... 324/158 F |
| 4,962,356 | 10/1990 | Eberlein et al. ....... 324/158 P |
| 4,963,822 | 10/1990 | Prokopp .............. 324/158 F |
| 4,982,153 | 1/1991 | Collins ............... 324/158 F |

OTHER PUBLICATIONS

"Automated Testing of Metalized Ceramic-Polyamide (MCP) Substrates" By D. Foster et al. May 20-23 pp. 548-553.

J. M. Ney Company Catalog, dated Jan. 1986.

Primary Examiner—Vinh Nguyen
Attorney, Agent, or Firm—Merchant, Gould, Smith, Edell, Welter and Schmidt P.A.

[57] ABSTRACT

A method and apparatus for real-time testing of a Tape Automated Bonded integrated circuit is described. The apparatus is inserted between a test board and a TAB tape integrated circuit. The beams of the assembly are arranged in a pattern similar to the pattern of the electrical contact pads on the test board and the TAB tape. When axial pressure is applied to the test board, the apparatus and the TAB tape, the beams compress and deform, thereby providing a scrubbing contact between the ends of the beams and the contact pads of the TAB tape and the test board. The beams are short in length thereby providing an electrical connection of virtually no impedance interface between the TAB tape and the test board, thereby allowing the intergrated circuit to be tested at AC speed.

10 Claims, 4 Drawing Sheets

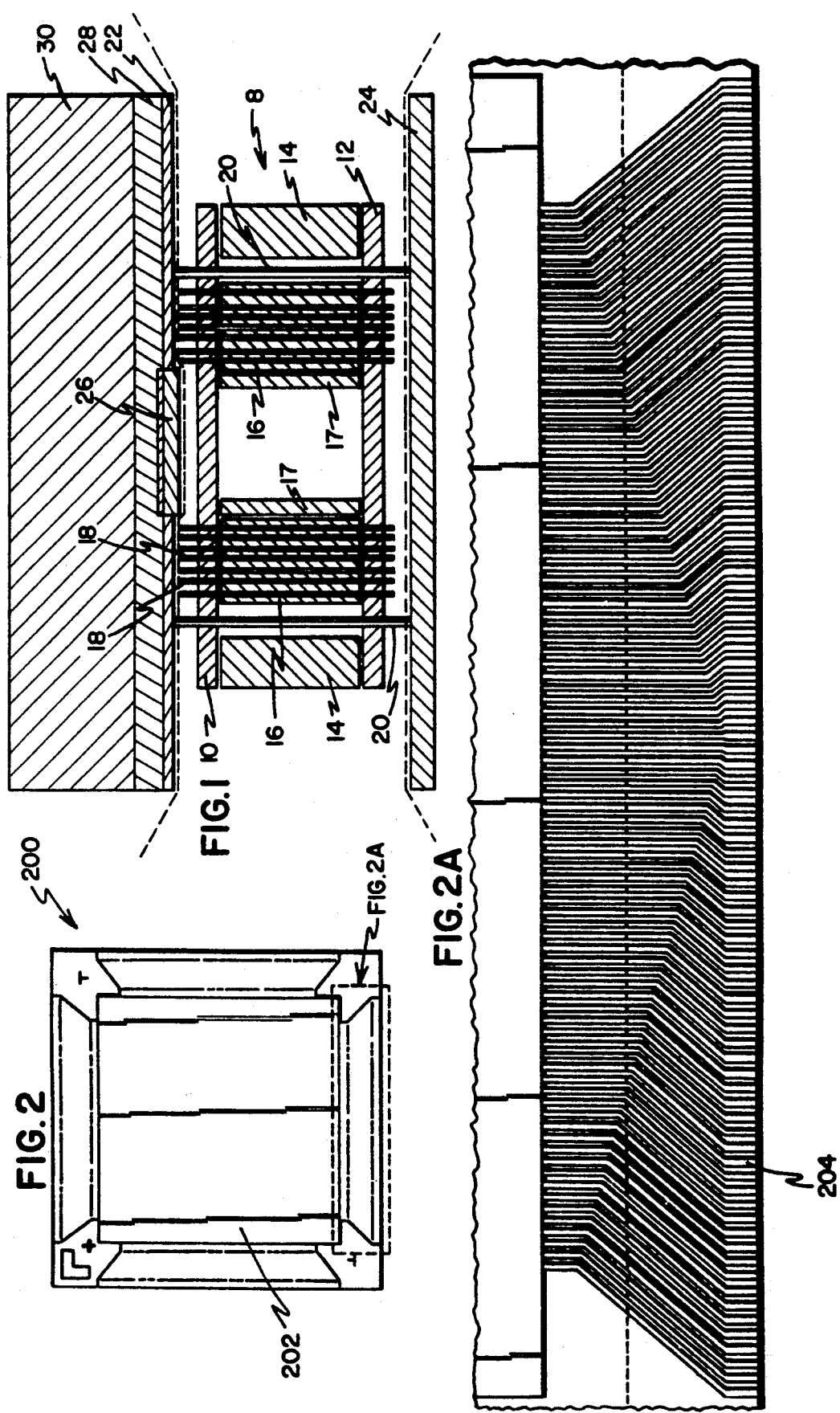

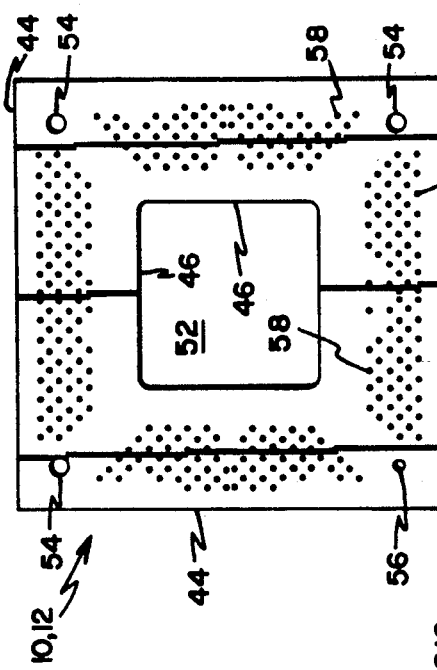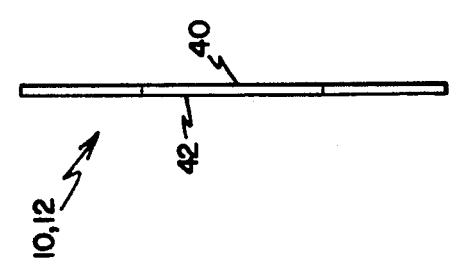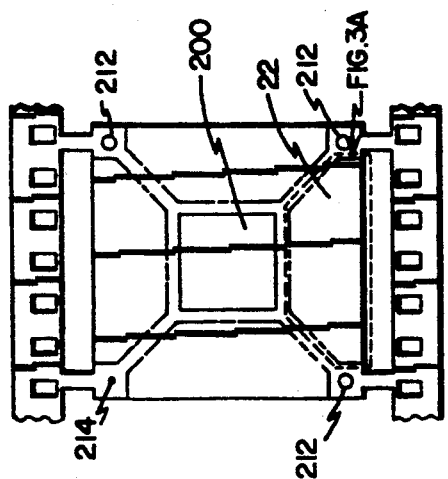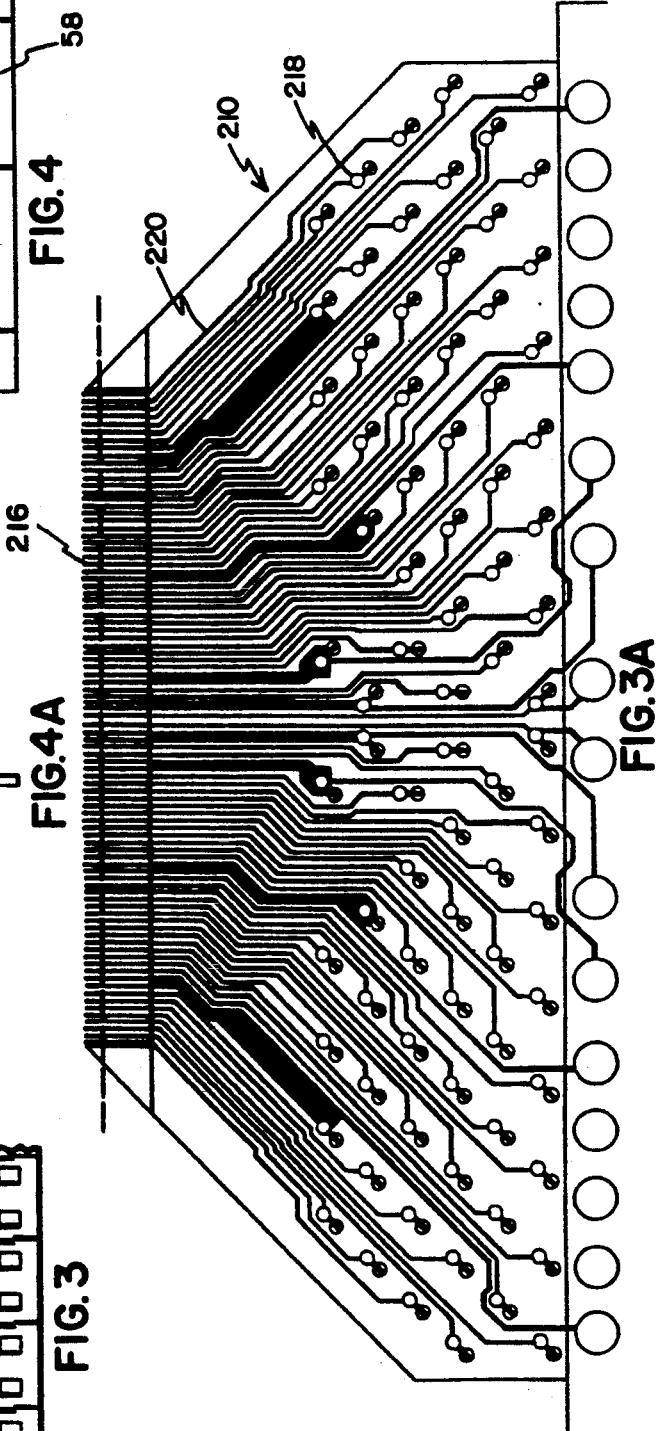

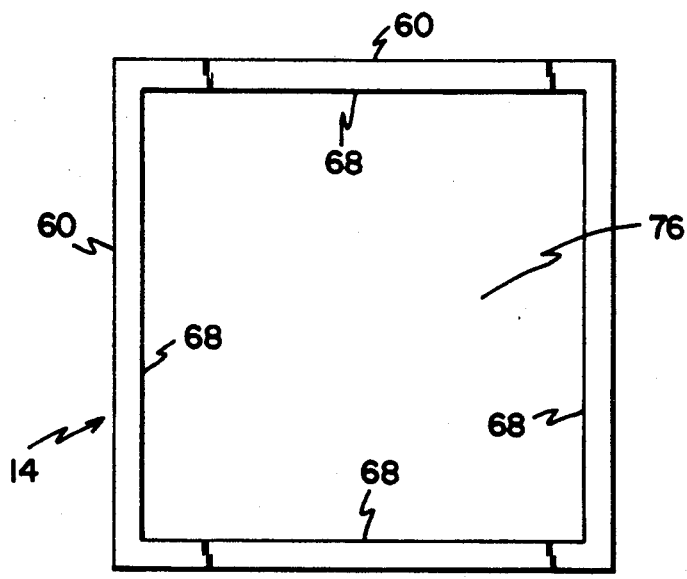
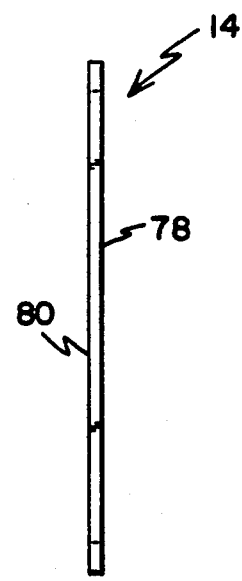
FIG.5     FIG.5A
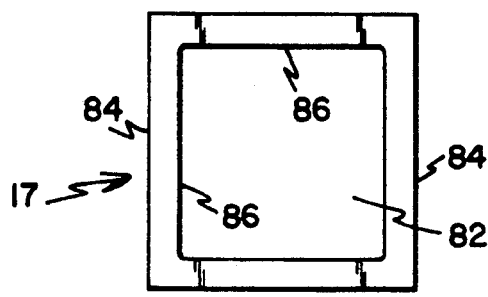
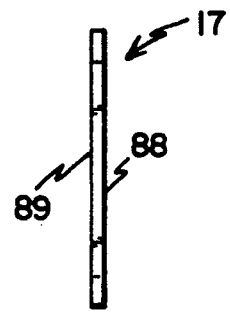
FIG.6     FIG.6A
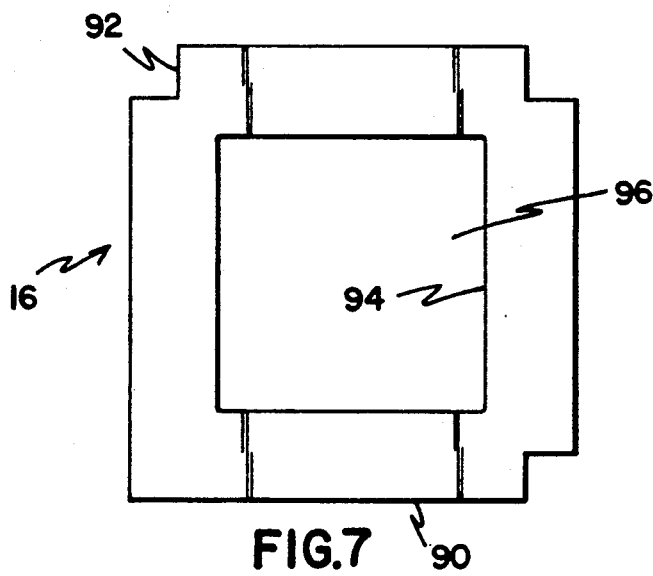
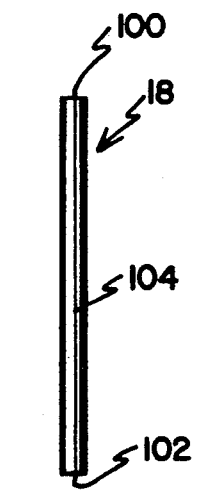
FIG.7     FIG.8

DUAL CONTACT BEAM ASSEMBLY FOR AN IC TEST FIXTURE

FIELD OF THE INVENTION

This invention relates generally to a method and apparatus for at-speed testing of a Tape Automated Bonded (TAB) integrated circuit. In particular, it is directed to an apparatus for use in testing which utilizes a dual contact beam assembly that ensures a scrubbing contact is made with both a daughter board and the TAB tape.

BACKGROUND OF THE PRIOR ART

In high speed supercomputers, such as the types manufactured by Cray Research, Inc., the assignee of the present invention, banks of printed circuit boards containing integrated circuit devices are used to complete the circuitry which enables high speed calculations to be performed. Each semiconductor chip may exhibit different speed characteristics, even ones manufactured on the same wafer. Therefore, prior to beginning actual production of a supercomputer, it is important that each integrated circuit is tested to ensure that none of the circuits contain electrical open or short circuits and to ensure the circuit is able to run at the high clock speeds that the supercomputers require.

Some variations of errors on an integrated circuit will only be detectable with at-speed testing. At-speed or AC testing refers to high-speed testing the integrated circuit at or near the same speed it will operate in the computer. A testing method must be capable of conducting the tests at speeds up to 1GHz. Also, the testing device must not introduce any parasitics. At high frequencies, if parasitics were introduced, the testing device would not record accurate data. From a cost standpoint, it is important that such testing is conducted quickly and efficiently. It is clear that there has existed an unfilled need in the prior art for an at-speed integrated circuit testing apparatus and method to ensure the actual performance of the circuit meets the predetermined specifications.

SUMMARY OF THE INVENTION

To overcome the limitations in the prior art described above, and to overcome other limitations that will become apparent upon reading and understanding the present specification, the present invention provides a method and apparatus for at-speed testing of integrated circuits at or near the speed at which the integrated circuit will operate in the computer or other electronic device. A dual contact beam assembly is inserted between a testing board or "daughter board" and a Tape Automated Bonded (TAB) integrated circuit. The wire "beams" of the assembly are arranged in a pattern similar to the pattern of the electrical contact pads on the daughter board and TAB tape.

The beams are short in length, thereby providing electrical paths which are virtually free of impedance interfaces and are comprised of wire which compresses and deforms elastically. When axial pressure is applied to the daughter board, the dual contact beam assembly and TAB tape, the beams compress and deform thereby providing a scrubbing contact between one end of the beams and the contact pads on the TAB tape, and the other end of the beam with the contact pads on the daughter board. Therefore an electrical connection with virtually no impedance interface (change in characteristic impedance which may cause reflections) between the TAB tape and the daughter board is provided thereby allowing the integrated circuit to be tested at AC speed.

BRIEF DESCRIPTION OF THE DRAWINGS

FIG. 1 is a side cross-sectional view of an apparatus constructed according to the preferred embodiment of the invention, where the apparatus is greatly exaggerated in the vertical direction, along with a TABed IC, a daughter card and axial pressure means needed for testing;

FIG. 2 is a planar top view of a chip carrier which carries the integrated circuit to be tested;

FIG. 2A is an enlarged view of the lead pattern of FIG. 2 taken along the dashed lines;

FIG. 3 is a planar top view of the surface of a TABed integrated circuit;

FIG. 3A is an enlarged view of the lead pattern of FIG. 3 taken along the dashed lines;

FIG. 4 is a planar top view of a template with alignment apertures for beams and alignment pins;

FIG. 4A is a side view of the template of FIG. 4;

FIG. 5 is a planar top view of an outer spacer;

FIG. 5A is a side view of the outer spacer of FIG. 5;

FIG. 6 is a planar top view of an inner spacer;

FIG. 6A is a side view of the inner spacer of FIG. 6;

FIG. 7 is a planar top view of a filler;

FIG. 8 is a side view of a beam;

DETAILED DESCRIPTION OF THE PREFERRED EMBODIMENT

Figure 9:
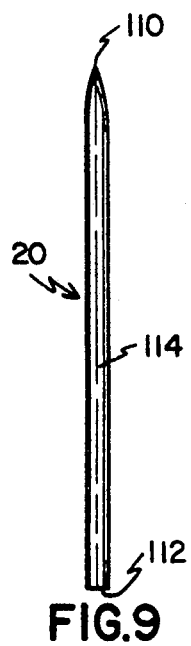
FIG. 9 is a side view of an alignment pin.

In the following Detailed Description of the Preferred Embodiment, reference is made to the accompanying Drawings which form a part hereof, and in which is shown by way of illustration a specific embodiment in which the invention may be practiced. It is to be understood that the other embodiments may be utilized and structural changes may be made without departing from the scope of the present invention.

The high speed, high density electronic devices under test exhibit above average power consumption characteristics. Such power consumption leads to extreme heat generation. Prior to beginning actual production of an expensive, complicated supercomputer, it is essential that each individual integrated circuit device be tested at its estimated operating temperature to ensure against temperature caused failure. An example of method and apparatus for cooling the device under test in the present invention shown on FIG. 1., is described in U.S. patent application No. 07/307,259, filed Feb. 6, 1989, by David R. Collins, et al., entitled "Method and Apparatus for Cooling an Integrated Circuit Chip During Testing" now U.S. Pat. No. 4,982,153 issued Jan. 1, 1991 assigned to the same assignee as the present, application which is hereby incorporated by reference.

Packaged integrated circuits are usually tested by way of a test socket or test socket/carrier combination. Many such test sockets utilize a lid or cover plate which serves the purpose of positioning and holding the integrated circuits in place such that intimate contact is made between the integrated circuit leads and the test socket contact pins. The lid will also allow for quick insertion and removal of the integrated circuit. An example of a test socket used with the present invention is described in U.S. patent application No. 07/234,818, to D. Eberlein, et al., filed Aug. 19, 1988, entitled "Integrated Test Circuit Socket" now U.S. Pat. No. 4,962,356, issued Oct. 9, 1990 which is assigned to the assignee of the present invention, and which is hereby incorporated by reference.

The integrated test circuits being tested often contain hundreds of I/O connections. Thus, there is a need in the art for high density interconnects on chip carriers, which can provide traces directly from the integrated circuit package within the carrier to the periphery of the carrier fabricated entirely with thin film techniques. An example of a chip carrier used to package an integrated circuit under test in the present invention is described in U.S. patent application No. 07/343,506 to R. R. Steitz, et al., filed Apr. 25, 1989, entitled "Metalized Ceramic Chip Carriers" which is assigned to the assignee of the present invention, and which is hereby incorporated by reference.

Carriers must provide reliable electrical connections between integrated circuits and printed circuit boards. Printed circuit boards must also have reliable electrical connections to other printed circuit boards or devices. Tape Automated Bonding (TAB) tape provides a carrier that ensures that the lead pattern thereon is substantially flat and of consistent geometry. An example of the TAB tape used to connect to the carrier in the present invention is described in U.S. patent application No. 07/545,271, filed Jun. 28, 1990, entitled "Flexible Automated Bonding Apparatus for Chip Carriers and Printed Circuit Boards" which is assigned to the assignee of the present invention, and which is hereby incorporated by reference.

The present invention provides a method and apparatus for at-speed testing of integrated circuits. More specifically, a dual contact beam assembly is disclosed as the preferred embodiment which provides a simple, rugged and reliable electrical contact between a Tape Automated Bonded (TAB) integrated circuit and a test board or "daughter card".

FIG. 1 shows a cross sectional view greatly exaggerated in the vertical direction of an integrated circuit testing device utilizing the dual contact beam assembly 8. The dual contact beam assembly 8 is placed between a test board or "daughter card" 24, and a Tape Automated Bonded (TAB) device under test (DUT) 26, in this case, an integrated circuit (IC). The beams 18 of the invention are arranged in a manner where a first end of the beam 100 is in electrical contact with the probe pads 218 of the TAB tape 22 and the second end of the beam 102 is in electrical contact with the probe pads of the daughter card 24. Three alignment pins 20 ensure that the beam assembly 8 is aligned with both the daughter card 24 and the TAB tape 22.

Axial pressure is applied to the TABed IC 22, the dual contact beam assembly 8 and the daughter card 24. A resilient pad 28 is attached to a sleeve 30 to ensure that even pressure is applied to the TAB tape 22 while not damaging the substantially rigid IC 26. The beams 18 elastically compress and deform due to the axial force, and bite through any oxide build-up between the end of the beams 100, 102 and the electrical contact pads 218. Thus, a "scrubbing" contact is achieved. Now the TABed IC 22 has a reliable electrical contact with the daughter card 24 and may be tested.

To test the integrated circuit 26, it is placed in a cavity 202 of a ceramic chip carrier 200, as shown in FIG. 2. The ceramic chip carrier 200 has a conductive lead pattern 204 as shown in FIG. 2A which is interconnected with the integrated circuit's leads.

The carrier's lead pattern 204 is identical to a TAB tape lead pattern 216 as shown in FIG. 3A. The TAB tape lead pattern 216 is interconnected to the carrier's lead pattern 204 and has electrical leads 220 etched from a copper layer on the TAB tape, terminating at substantially circular probe pads 218 with a diameter measuring 10 mils. The probe pads 218 may be used to provide a place where the electrical connection between the printed circuit board and chip carrier can easily be severed or also used as contact points for electrical test apparatus, as used by the present invention. The TAB tape 22 ensures that the lead pattern is substantially flat and of consistent geometry.

Both an upper template 10 and a lower template 12 are needed for the dual contact beam assembly 8. FIG. 4 shows an enlarged top view of a standard template 10,12 of the preferred embodiment, which could be either the upper template 10 or the lower template 12 as they are substantially similar. In the preferred embodiment, the template 10,12 is made of polyetherimide (commercially available as Ultem TM made by Precision Punch and Plastic), a rugged, substantially rigid material, or with other suitable substantially rigid materials, with a thickness of 0.030 inches. The template 10,12 is substantially square with a central opening 52, which is also substantially square. The outer side edges of the template 44 measure 1.31 inches while the inner side edges 46 measure 0.560 inches.

In the preferred embodiment three alignment apertures 54 are drilled in three corners of the template 10,12. These alignment apertures 54 are substantially circular with a diameter of 0.625 inches. In fourth corner, an orientation identifier 56 is drilled to ensure that the alignment apertures 54 are correctly oriented.

A plurality of beam alignment apertures 58, are drilled in the template 10,12 in a pattern similar to the pattern of the probe pads 28 on the TAB tape 22. Those skilled in the art will readily recognize that a wide variety of patterns could be substituted for the patterns shown without deviating from the spirit and scope of the present invention. The beam alignment apertures 58 are substantially circular with a diameter of 0.0083 inches.

FIG. 5 shows an enlarged top planar view of an outer spacer 14. The outer spacer is substantially square with a substantially square central opening 76. The outer side edges 60 of the outer spacer measure 1.310 inches and the inner side edges 68 measure 1.23 inches. In the preferred embodiment, the outer spacer 14 is cut from cellulose acetate butyrate or with other suitable materials such as substantially rigid plastics, with a thickness of 0.020 inches.

FIG. 6 shows an enlarged top planar view of an inner spacer 17. The inner spacer is substantially square with a substantially square central opening 82. The outer side edges 84 of the inner spacer measure 0.720 inches and the inner side edges 86 measure 0.560 inches In the preferred embodiment, the inner spacer 17, like the outer spacer 14, is cut from cellulose acetate butyrate or with other suitable materials such as substantially rigid plastics, with a thickness the same as the outer spacer 14, 0.020 inches.

FIG. 7 shows an enlarged top planar view of a filler 16. The filler is a substantially square, electrically non-conducting silicone rubber with substantially square portions cut from three corners. The outer side edge of the filler 90 measures 1.20 inches with a thickness of 0.015 inches. The side edge of the cut-out square 92 from each of three corners measures 0.130 inches. The three corners with the square cut-out correspond to the three alignment apertures 54 of the template. The fourth corner is then aligned with the orientation identifier 56 of the template. The filler has a substantially square central opening 96 with inside edges 94 measuring 0.730 inches.

FIG. 8 shows an enlarged view of a beam 18. The beam is cylindrical in shape with a first end 100 and second end 102, both substantially circular with a diameter of 0.007 inches. The body 104 of the beam is approximately 0.100 inches in length with an allowable tolerance of 0.0002 inches. The beam 18 is made of wire which elastically deforms and compresses when subject to axial pressure, such as in the preferred embodiment Paliney ® manufactured by the J. M. NEY Company or beryllium copper (BeCu) wire. The beam is electrically conductive in nature, and as a result of its short length, provides a virtually undetectable impedance interface when making an electrical connection. A wide variety of other electrically conducting materials may also be suitable for beam 18 such as gold alloys, copper alloys, nickel alloys and the like.

FIG. 9 shows an enlarged view of an alignment pin 20. The alignment pin 20 is cylindrical in shape with a first end 110 and a second end 112, both substantially circular with a diameter of 0.0595 inches. In the preferred embodiment, the first end 110 is tapered to facilitate placement of the alignment pin 20 into alignment apertures 54. The body 114 of the alignment pin is 0.5 inches in length.

Figure 10:
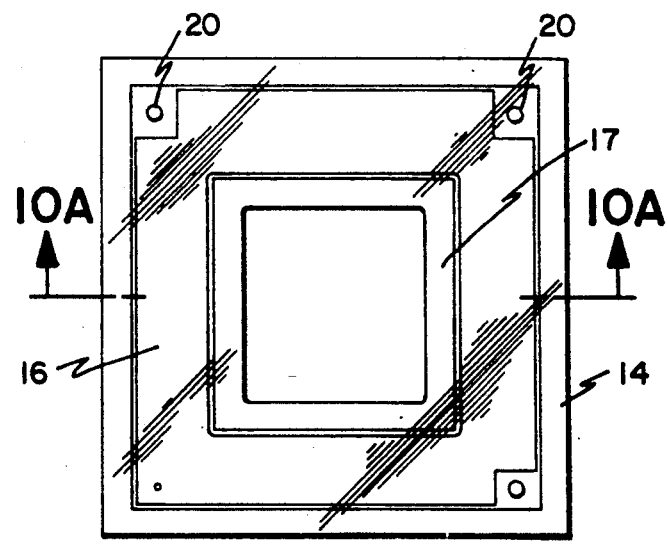
FIG. 10 is a planar top view of the preferred embodiment, where the outer spacer and templates are bonded together and the filler is placed inside the outer spacer and between the templates.
Figure 10A:
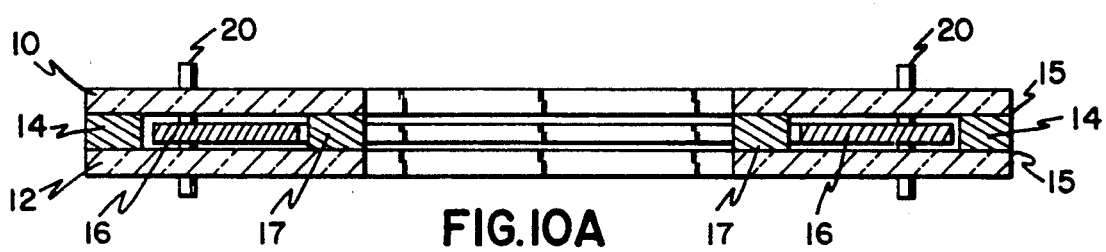
FIG. 10A is a side cross-sectional view of FIG. 10 which also shows the alignment pins.

FIG. 10A shows a cross sectional view of the dual contact beam assembly 8 while FIG. 10 shows a top planar view. One alignment pin 20 is placed into each of the three alignment apertures 54 of the lower template 12. The outer spacer 14 is aligned with the lower template 12 by aligning the outer side edges of the outer spacer 60 with the outer side edges of the lower template 44. The outer spacer 14 is then bonded to the lower template 12 with an adhesive means 15 applied between the top planar face 40 of the lower template 12 and the bottom planar face of the outer spacer 80. In the preferred embodiment of the invention, the adhesive means may be Permabond glue or other suitable adhesives. The outer spacer 14 does not cover any of the beam alignment apertures 58.

The inner spacer 17 is next aligned with the lower template 12 by aligning the inner side edges of the inner spacer 86 with the inner side edges of the lower template 46. The adhesive means 15 is applied between the top planar face of the lower template 12 and the bottom planar face of the inner spacer 88.

The filler 16 is placed between the outer spacer 14 and the inner spacer 17. The filler 16 must be aligned such that the corners with the square cut-out correspond to the corners with the three alignment pins 20. The filler 16 does not come in contact with the alignment pins 20. The corner without the square cut-out is thus aligned with the orientation identifier 56 of the lower template 12.

The upper template 10, is aligned with the outer spacer 14, the inner spacer 17, and lower template 12 by placing the alignment pins 20 through the alignment apertures 54 of the upper template 10 while leaving the alignment pins 20 also placed through the alignment apertures 54 of the lower template 12. The upper template 10 is bonded to the outer spacer 14 and the inner spacer 17 with the adhesive means applied between the top planar face of the outer spacer 78, the top planar face of the inner spacer 89, and the bottom planar face 42 of the upper template 10. The orientation identifier 56 of the upper template 10 and the lower template 12 should also be aligned.

The three alignment pins 20 are removed. One beam 18 is inserted into each beam alignment aperture 58 of the upper template 10 and pushed through the filler 16 and out the corresponding beam alignment aperture 58 of the lower template 12. The first end of the beam 100 must protrude out of the beam alignment aperture 58 of the upper template 10 while the second end of the beam 102 must protrude out of the beam alignment aperture 58 of the lower template 12.

Figure 11:
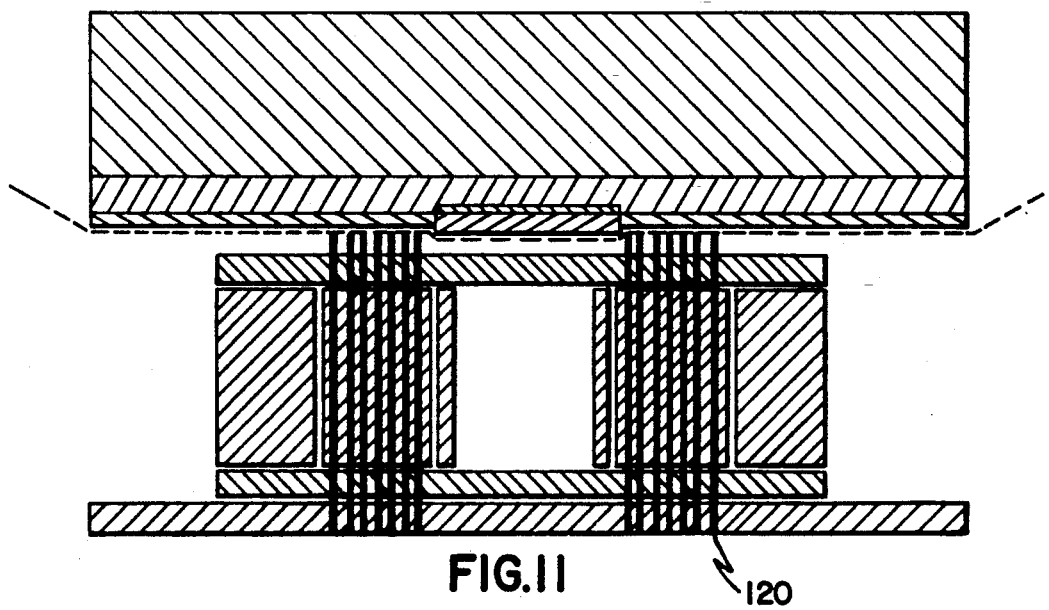
FIG. 11 is a side cross-sectional view of a second embodiment of the present invention, greatly exaggerated in the vertical direction where the beams are soldered to the daughter board.

According to a second embodiment of the invention, the second end of the beams 102 may be soldered to the daughter card 24 as shown in FIG. 11. This forms a solder connection 120 between the beam 18 and the daughter card 24, thereby leaving only the first end of the beams 100 to protrude freely from the beam alignment apertures 58 of the upper template. The solder connection 120 will reduce wear in both the beams 100 and the daughter card's probe pads.

When axial pressure is applied to the TAB tape 22, dual contact beam assembly 8, and daughter card 24, the beams 18 elastically compress and deform. The first end of the beam 100 and the TAB tape probe pads 218 form a scrubbing contact while the second end of the beam 102 is soldered to the daughter card 24, thereby forming a reliable electrical connection, free of impedance interfaces.

Although two preferred embodiments have been illustrated and described for the present invention, it will be appreciated by those of ordinary skill in the art that any apparatus which is calculated to achieve the same purpose may be substituted for the specific configurations shown. This application is intended to cover any adaptations or variations of the present invention. Therefore, it is manifestly intended that this invention be limited only by the appended claims and the equivalents thereof.

We claim:

1. A dual contact beam assembly apparatus for at-speed testing of integrated circuits, comprising:
    a first non-conducting, substantially rigid template having a plurality of holes arranged in a pattern;
    a second non-conducting, substantially rigid template having a plurality of holes arranged in a pattern similar to said first template;
    spacer means for maintaining a predetermined distance between said first template and said second template;
    an electrically non-conducting filler to be placed between said first and second templates, said filler having a plurality of holes arranged in a pattern similar to said first plate;

means for attaching said spacer means to said first and second templates;

a plurality of wire beams which compress and deform elastically, one of said beams being placed within each of said holes and arranged in said pattern on said templates, said beams protruding out of said holes of said first template, said second template; and said filler and means for alignment of said first template and said second template, wherein said means for alignment further includes:

said first template and said second template each include at least one alignment aperture;

said first template and said second template each include an orientation identifier; and at least one alignment pin for placement in said alignment aperture.

2. The apparatus of claim 1, wherein said means for alignment comprises:

said first template and said second template each include three alignment apertures;

said first template and said second template each include an orientation identifier; and three alignment pins for placement in said alignment apertures.

3. The apparatus of claim 1, wherein said spacer means comprises a substantially rigid outer spacer, having the same outer dimensions as that of said first and second templates and having inside dimensions such that said electrically non-conductive filler may be placed inside outer spacer boundaries.

4. The apparatus of claim 3, wherein said spacer means further comprises a substantially rigid inner spacer, having the same inner dimensions as that of dimensions of an inner opening of said first and second templates and having outer dimensions such that said electrically nonconductive filler may be placed between said outer spacer and said inner spacer.

5. The apparatus of claim 1, wherein said beams comprise beryllium copper wires.

6. The apparatus of claim 1, wherein said beams comprise Paliney ® wires.

7. The apparatus of claim 1, wherein said templates comprise polyetherimide.

8. The apparatus of claim 1, wherein said filler comprises an electrically non-conductive silicone rubber.

9. The apparatus of claim 3, wherein said outer spacer and inner spacer comprise cellulose acetate butyrate.

10. The apparatus of claim 1, wherein one end of said beams is soldered onto a daughter card.

* * * * *

UNITED STATES PATENT AND TRADEMARK OFFICE
CERTIFICATE OF CORRECTION

PATENT NO. : 5,175,496

DATED : December 29, 1992

INVENTOR(S) : David R. Collins et al.

It is certified that error appears in the above-identified patent and that said Letters Patent is hereby corrected as shown below:

In column 8, line 12 (claim 4), "nonconductive" should read --non-conductive-- therefore.

Signed and Sealed this

Second Day of November, 1993

Attest:

BRUCE LEHMAN

Attesting Officer     Commissioner of Patents and Trademarks